US010996700B1

(12) United States Patent
Tan

(10) Patent No.: US 10,996,700 B1
(45) Date of Patent: May 4, 2021

(54) FAST RESPONSE LINEAR REGULATOR WITH BIAS CURRENT CONTROL AND OVERSHOOT AND UNDERSHOOT SUPPRESSION

(71) Applicant: PixArt Imaging Incorporation, HsinChu (TW)

(72) Inventor: Kok-Siang Tan, Penang (MY)

(73) Assignee: PIXART IMAGING INCORPORATION, Hsinchu (TW)

( * ) Notice: Subject to any disclaimer, the term of this patent is extended or adjusted under 35 U.S.C. 154(b) by 0 days.

(21) Appl. No.: 16/706,717

(22) Filed: Dec. 7, 2019

(51) Int. Cl.
| | |
|---|---|
| *G05F 1/575* | (2006.01) |
| *H03F 3/21* | (2006.01) |
| *H03F 1/52* | (2006.01) |
| *G05F 3/26* | (2006.01) |
| *G05F 1/569* | (2006.01) |

(52) U.S. Cl.
CPC ............. *G05F 1/575* (2013.01); *G05F 1/569* (2013.01); *G05F 3/26* (2013.01); *H03F 1/523* (2013.01); *H03F 3/21* (2013.01)

(58) Field of Classification Search
CPC ............. G05F 1/575; G05F 1/569; G05F 3/26
See application file for complete search history.

(56) References Cited

U.S. PATENT DOCUMENTS

| 5,929,616 A | * | 7/1999 | Perraud | .................... G05F 1/569 323/274 |
| 7,502,719 B2 | * | 3/2009 | Moraveji | ................ G05F 1/575 702/185 |
| 2008/0290910 A1 | * | 11/2008 | Mayell | .................... G05F 1/575 327/108 |

OTHER PUBLICATIONS

K. Li, C. Yang, T. Guo and Y. Zheng, "A Multi-Loop Slew-Rate-Enhanced NMOS LDO Handling 1-A-Load-Current Step With Fast Transient for 5G Applications," in IEEE Journal of Solid-State Circuits, vol. 55, No. 11, pp. 3076-3086, Nov. 2020, doi: 10.1109/JSSC.2020.3005789. (Year: 2020).*

* cited by examiner

*Primary Examiner* — Peter M Novak
(74) *Attorney, Agent, or Firm* — Tung & Associates

(57) ABSTRACT

A fast response amplifier circuit includes a pre-stage circuit and an output stage circuit. The pre-stage circuit generates a control signal according to a difference between a first input signal and a second input signal. The output stage circuit generates an output signal at an output node according to the control signal. The output stage circuit includes: a power transistor controlled by a driving signal to generate the output signal; a voltage positioning transistor operates according to the output signal to steer a first portion and a second portion of a bias current; an overshoot detecting circuit detecting an overshoot of the output signal to generate an overshoot indicating signal; and a first overshoot suppressor which generates a first overshoot suppressing signal according to the overshoot indicating signal to adjust a conduction resistance of the power transistor to suppress an overshoot of the output signal.

17 Claims, 9 Drawing Sheets

FAST RESPONSE LINEAR REGULATOR WITH BIAS CURRENT CONTROL AND OVERSHOOT AND UNDERSHOOT SUPPRESSION

BACKGROUND OF THE INVENTION

Field of Invention

The present invention relates to a linear regulator. Particularly it relates to a fast response linear regulator. The present invention also relates to a fast response amplifier circuit for use in the linear regulator.

Description of Related Art

FIG. 1 shows a prior art linear regulator which includes a pre-stage circuit 100 and an output stage circuit 200. A power transistor Mpp generates the output signal Vo according to a driving signal Vpg, and a voltage positioning transistor Mset is controlled by a voltage difference of a control signal Vset provided by the pre-stage circuit 100 and the output signal Vo to steer a first portion (Ibb1) and a second portion (Ibb2) of the bias current Ibb, whereby the output signal is regulated.

The prior art circuit in FIG. 1 has a drawback that the bias current Ibb is fixed. Therefore, if fast load transient response is desired, the bias current Ibb is required to be high.

Compared to the prior art in FIG. 1, the present invention is advantageous in that fast load transient response can be achieved while the quiescent current is kept low, especially for regulators without an output capacitor.

SUMMARY OF THE INVENTION

From one perspective, the present invention provides a fast response amplifier circuit, comprising: a pre-stage circuit, configured to operably generate a control signal according to a difference between a first input signal and a second input signal; an output stage circuit, configured to operably generate an output signal at an output node according to the control signal; wherein the output stage circuit includes: a bias current circuit, configured to operably generate a bias current at a bias node; a bias load circuit, coupled between an input power and the bias node, and configured to operably generate a driving signal according to a first portion of the bias current, wherein the first portion of the bias current flows through the bias load circuit; a power transistor, coupled between the input power and the output node, wherein the power transistor is controlled by the driving signal to generate the output signal; and a voltage positioning transistor, coupled between the output node and the bias node, wherein the voltage positioning transistor and the power transistor form a driving branch, and a second portion of the bias current flows through the driving branch, wherein the voltage positioning transistor operates according to a voltage difference of the control signal and the output signal to steer the first portion and the second portion of the bias current, whereby the output signal is regulated; wherein the output stage circuit further includes: an overshoot detecting circuit, coupled to the bias node and configured to operably detect an overshoot of the output signal according to a voltage on the bias node to generate an overshoot indicating signal; and a first overshoot suppressor, configured to operably generate a first overshoot suppressing signal according to the overshoot indicating signal to control the power transistor to adjust a conduction resistance of the power transistor, whereby when the overshoot of the output signal is detected, the overshoot of the output signal is suppressed to be lower than a predetermined level.

In one embodiment, the first overshoot suppressor includes: a voltage to current converter, configured to operably generate a suppressing current according to the overshoot indicating signal; and a first current mirror circuit, configured to operably generate the first overshoot suppressing signal by mirroring the suppressing current.

In one embodiment, the output stage circuit further includes a second overshoot suppressor coupled to the output node, wherein the second overshoot suppressor includes: an overshoot suppressing transistor, coupled between the output node and a low reference signal, and configured to operably pull down the output signal to suppress the overshoot according to the overshoot indicating signal when the overshoot is detected.

In one embodiment, the output stage circuit further includes an undershoot suppressor, wherein the undershoot suppressor includes: an undershoot suppressing capacitor, coupled between the output node and a bias adjusting node of the bias current circuit, and configured to operably generate an undershoot suppressing signal at the bias adjusting node to increase the bias current to suppress an undershoot of the output signal when an undershoot of the output signal is detected.

In one embodiment, the bias current circuit includes: a reference current source which is configured to operably provide a reference current; and at least a second current mirror circuit, configured to operably generate the bias current by mirroring the reference current source, wherein the bias adjusting node is a control terminal of the second current mirror circuit, wherein the second current mirror circuit operates according to a voltage at the control terminal of the second current mirror circuit.

In one embodiment, the first overshoot suppressor includes: a voltage to current converter, configured to operably generate a suppressing current according to the overshoot indicating signal; and a first current mirror circuit, configured to operably generate the first overshoot suppressing signal by mirroring the suppressing current.

In one embodiment, the fast response amplifier circuit further comprises a second overshoot suppressor coupled to the output node, wherein the second overshoot suppressor includes: an overshoot suppressing transistor, coupled between the output node and a low reference signal, and configured to operably pull down the output signal to suppress an overshoot according to the overshoot indicating signal when an overshoot is detected.

In one embodiment, the bias load circuit includes: a pull-up transistor or a pull-up current source; a common-gate transistor, coupled in series with the pull-up transistor or the pull-up current source between the input power and the bias node to generate the driving signal at a joint node of the common-gate transistor and the pull-up transistor or the pull-up current source.

In one embodiment, the overshoot detecting circuit includes an overshoot detecting transistor and a first biasing resistor, wherein the overshoot detecting transistor and the first biasing resistor are coupled in series between the output node and a low reference signal, wherein a control terminal of overshoot detecting transistor is coupled to the bias node to detect an overshoot of the output signal to generate the overshoot indicating signal.

In one embodiment, the overshoot detecting circuit includes an overshoot detecting transistor and a first biasing resistor, wherein the overshoot detecting transistor and the first biasing resistor are coupled in series between the output node and a low reference signal, wherein a control terminal of overshoot detecting transistor is coupled to the bias node to detect an overshoot of the output signal to generate the overshoot indicating signal.

In one embodiment, the undershoot suppressor further includes a filtering resistor which is coupled to the undershoot suppressing capacitor, and is configured to operably reduce a noise of the undershoot suppressing signal at the bias adjusting node.

In one embodiment, the output stage circuit further includes an acceleration capacitor which is configured to operably couple an AC component of the output signal to the driving signal.

From another perspective, the present invention provides a fast response amplifier circuit, comprising: a pre-stage circuit, configured to operably generate a control signal according to a difference between a first input signal and a second input signal; an output stage circuit, configured to operably generate an output signal at an output node according to the control signal; wherein the output stage circuit includes: a bias current circuit, configured to operably generate a bias current at a bias node; a bias load circuit, coupled between an input power and the bias node, and configured to operably generate a driving signal according to a first portion of the bias current, wherein the first portion of the bias current flows through the bias load circuit; a power transistor, coupled between the input power and the output node, wherein the power transistor is controlled by the driving signal to generate the output signal; and a voltage positioning transistor, coupled between the output node and the bias node, wherein the voltage positioning transistor and the power transistor form a driving branch, and a second portion of the bias current flows through the driving branch, wherein the voltage positioning transistor operates according to a voltage difference of the control signal and the output signal to steer the first portion and the second portion of the bias current, whereby the output signal is regulated; wherein the bias current circuit includes: a reference current source which is configured to operably provide a reference current; and at least a second current mirror circuit, configured to operably generate the bias current by mirroring the reference current source, wherein the bias adjusting node is a control terminal of the second current mirror circuit, wherein the second current mirror circuit operates according to a voltage at the control terminal of the second current mirror circuit; wherein the output stage circuit further includes: an undershoot suppressing capacitor, coupled between the output node and a bias adjusting node of the bias current circuit, and configured to operably generate an undershoot suppressing signal at the bias adjusting node to increase the bias current to suppress an undershoot of the output signal when the undershoot of the output signal is detected.

From another perspective, the present invention provides a fast response linear regulator, comprising: a fast response amplifier circuit, configured to generate an output signal on an output node according to a difference between a voltage division of the output signal and a reference signal; and a voltage divider, coupled to the output node, and configured to operably generate a voltage division of the output signal; wherein the output signal is regulated to a level proportional to the reference signal; wherein the fast response amplifier circuit includes: a pre-stage circuit, configured to operably generate a control signal according to a difference between a first input signal and a second input signal; an output stage circuit, configured to operably generate an output signal at an output node according to the control signal; wherein the output stage circuit includes: a bias current circuit, configured to operably generate a bias current at a bias node; a bias load circuit, coupled between an input power and the bias node, and configured to operably generate a driving signal according to a first portion of the bias current, wherein the first portion of the bias current flows through the bias load circuit; a power transistor, coupled between the input power and the output node, wherein the power transistor is controlled by the driving signal to generate the output signal; and a voltage positioning transistor, coupled between the output node and the bias node, wherein the voltage positioning transistor and the power transistor form a driving branch, and a second portion of the bias current flows through the driving branch, wherein the voltage positioning transistor operates according to a voltage difference of the control signal and the output signal to steer the first portion and the second portion of the bias current, whereby the output signal is regulated; wherein the output stage circuit further includes: an overshoot detecting circuit, coupled to the bias node and configured to operably detect an overshoot of the output signal according to a voltage on the bias node to generate an overshoot indicating signal; a first overshoot suppressor, configured to operably generate a first overshoot suppressing signal according to the overshoot indicating signal to control the power transistor to adjust a conduction resistance of the power transistor, whereby when the overshoot of the output signal is detected, the overshoot of the output signal is suppressed to be lower than a predetermined level; an undershoot suppressor, coupled between the output node and a bias adjusting node of the bias current circuit, and configured to operably generate an undershoot suppressing signal at the bias adjusting node to increase the bias current to suppress an undershoot of the output signal when an undershoot of the output signal is detected; and a second overshoot suppressor, coupled between the output node and a low reference signal, and configured to operably pull down the output signal to suppress an overshoot according to the overshoot indicating signal when an overshoot is detected.

In one embodiment, the undershoot suppressor includes an undershoot suppressing capacitor which is coupled between the output node and a bias adjusting node of the bias current circuit; and the bias current circuit includes: a reference current source which is configured to operably provide a reference current; and at least a second current mirror circuit, configured to operably generate the bias current by mirroring the reference current source, wherein the bias adjusting node is a control terminal of the second current mirror circuit, wherein the second current mirror circuit operates according to a voltage at the control terminal of the second current mirror circuit; and the first overshoot suppressor includes: a voltage to current converter, configured to operably generate a suppressing current according to the overshoot indicating signal; and a first current mirror circuit, configured to operably generate the first overshoot suppressing signal by mirroring the suppressing current; and the second overshoot suppressor includes: an overshoot suppressing transistor, coupled between the output node and a low reference signal, and configured to operably pull down the output signal to suppress an overshoot according to the overshoot indicating signal when an overshoot is detected.

In one embodiment, the pre-stage circuit is powered by the output signal.

From another perspective, the present invention provides a fast response linear regulator, comprising: a fast response amplifier circuit, configured to generate a mirrored output signal according to a difference between a voltage division of a regulated output signal and a reference signal; and a voltage divider, configured to operably generate the voltage division of the regulated output signal; wherein the regulated output signal is regulated to a level proportional to the reference signal; wherein the fast response amplifier circuit includes: a pre-stage circuit, configured to operably generate a control signal according to the difference between the voltage division of the regulated output signal and the reference signal; a first output stage circuit, configured to operably generate the mirrored output signal through an output terminal of the first output stage circuit according to the control signal received through an input terminal of the first output stage circuit; a second output stage circuit, configured to operably generate the regulated output signal through an output terminal of the second output stage circuit according to the control signal received through an input terminal of the second output stage circuit; wherein each of the first output stage circuit and the second output stage circuit includes: a bias current circuit, configured to operably generate a bias current at a bias node; a bias load circuit, coupled between an input power and the bias node, and configured to operably generate a driving signal according to a first portion of the bias current, wherein the first portion of the bias current flows through the bias load circuit; a power transistor, coupled between the input power and the output terminal, wherein the power transistor is controlled by the driving signal to generate a driving output signal on the output terminal; and a voltage positioning transistor, coupled between the output terminal and the bias node, wherein the voltage positioning transistor and the power transistor form a driving branch, and a second portion of the bias current flows through the driving branch, wherein the voltage positioning transistor operates according to a voltage difference of a driving input signal through the input terminal of the output stage circuit and the driving output signal on the output terminal to steer the first portion and the second portion of the bias current, whereby the driving output signal on the output terminal is regulated; wherein the output stage circuit further includes: an overshoot detecting circuit, coupled to the bias node and configured to operably detect an overshoot of the driving output signal according to a voltage on the bias node to generate an overshoot indicating signal; a first overshoot suppressor, configured to operably generate a first overshoot suppressing signal according to the overshoot indicating signal to control the power transistor to adjust a conduction resistance of the power transistor, whereby when the overshoot of the driving output signal is detected, the overshoot of the driving output signal is suppressed to be lower than a predetermined level; an undershoot suppressor, coupled between the output terminal and a bias adjusting node of the bias current circuit, and configured to operably generate an undershoot suppressing signal at the bias adjusting node to increase the bias current to suppress an undershoot of the driving output signal when an undershoot of the driving output signal is detected; and a second overshoot suppressor, coupled between the output terminal and a low reference signal, and configured to operably pull down the driving output signal to suppress an overshoot according to the overshoot indicating signal when an overshoot is detected; wherein the control signal corresponds to the driving input signal of the first output stage circuit and the driving input signal of the second output stage circuit, and the mirrored output signal corresponds to the driving output signal of the first output stage circuit, and the regulated output signal corresponds to the driving output signal of the second output stage circuit.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
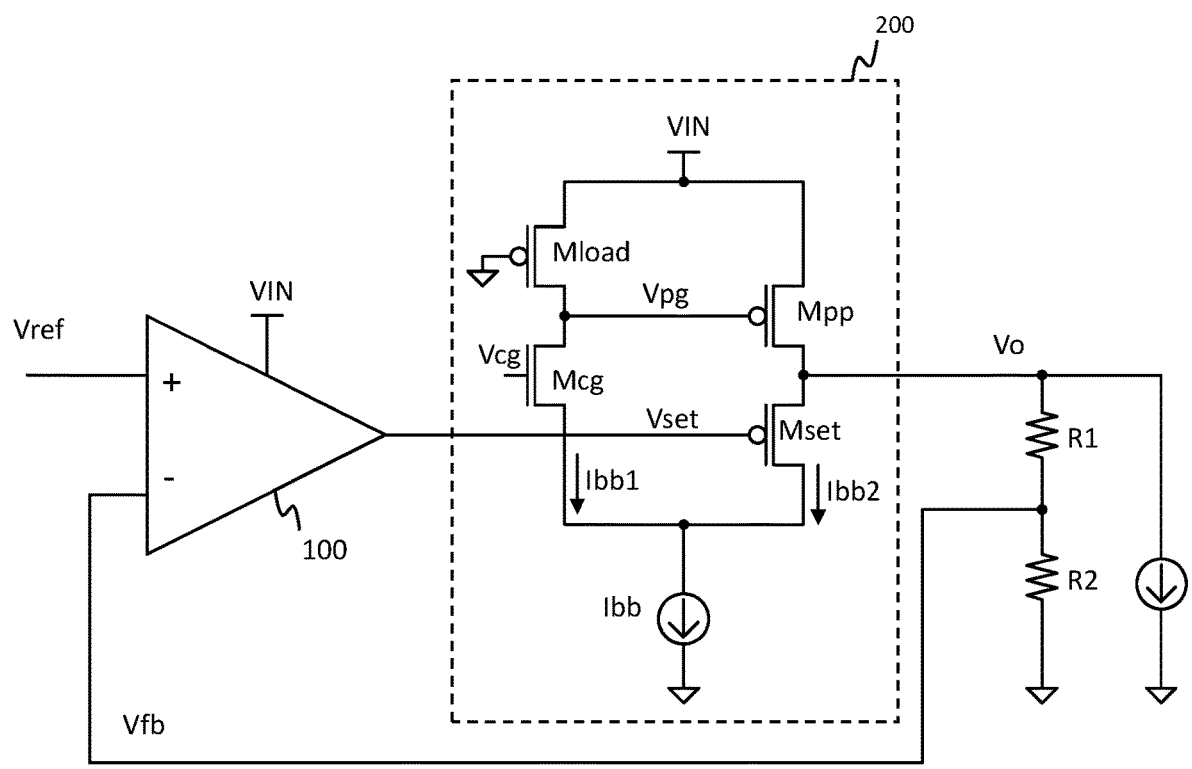
FIG. 1 shows a schematic diagram of a prior art linear regulator.
Figure 2:
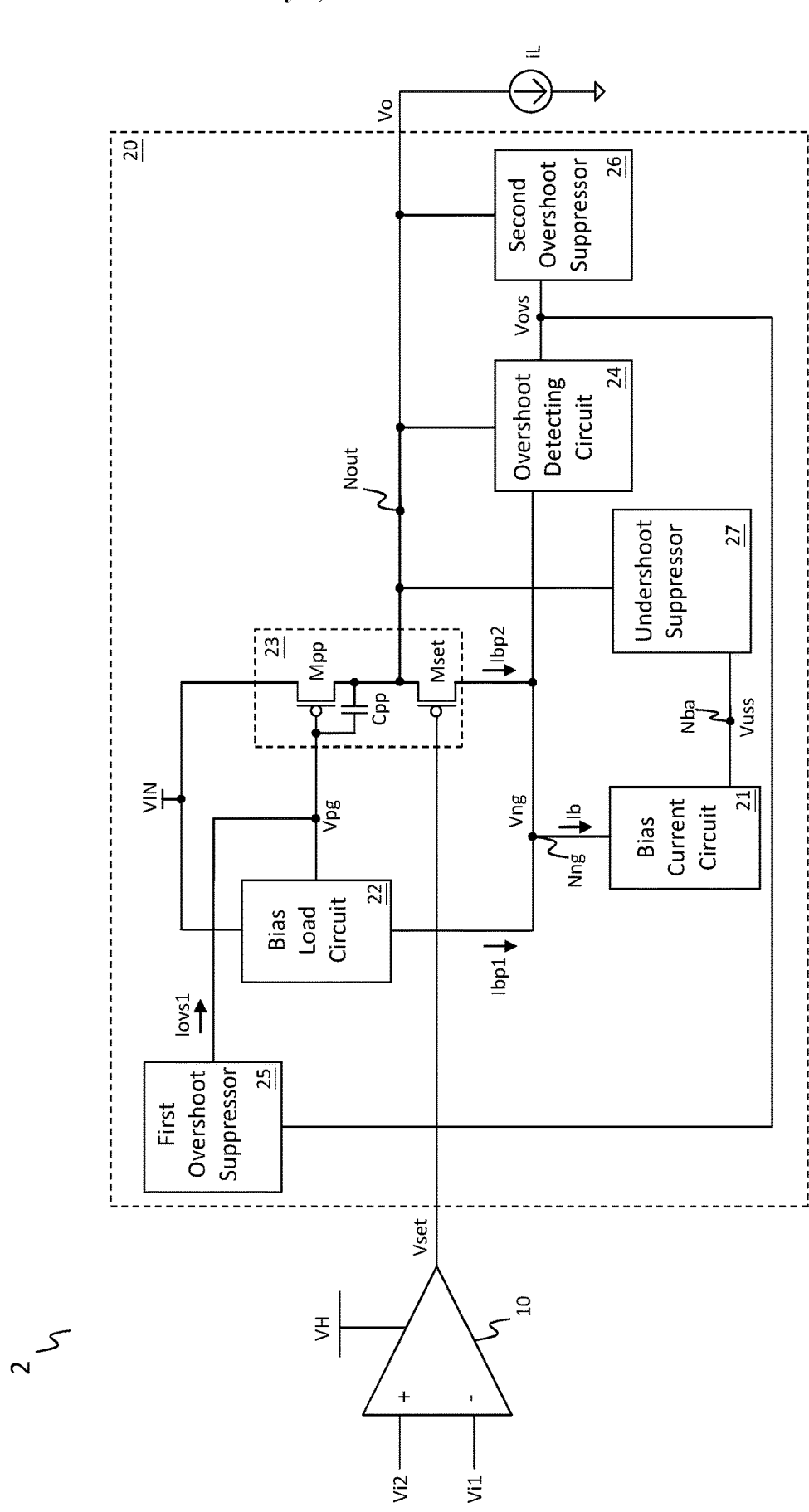
FIG. 2 shows a schematic diagram of an embodiment of the fast response amplifier circuit according to the present invention.

FIG. 2 shows a schematic diagram of an embodiment of the fast response amplifier circuit according to the present invention (fast response amplifier circuit 2). In one embodiment, as shown in FIG. 2, the fast response amplifier circuit 2 comprises a pre-stage circuit 10 and an output stage circuit 20. The pre-stage circuit 10 is configured to operably generate a control signal Vset according to a difference between a first input signal Vi1 and a second input signal Vi2. The output stage circuit 20 is configured to operably generate an output signal Vo at an output node Nout according to the control signal Vset. In this embodiment, the output signal drives a load iL.

Still referring to FIG. 2, in one embodiment, the output stage circuit 20 includes a bias current circuit 21, a bias load circuit 22, a power transistor Mpp, and a voltage positioning transistor Mset.

The bias current circuit 21 is configured to operably generate a bias current Ib at a bias node Nng. The bias load circuit 22 is coupled between an input power Vin and the bias node Nng, and is configured to operably generate a driving signal Vpg according to a first portion (Ibp1) of the bias current Ib, wherein the first portion (Ibp1) of the bias current Ib flows through the bias load circuit 22.

The power transistor Mpp is coupled between the input power Vin and the output node Nout. In this embodiment, the power transistor Mpp is controlled by the driving signal Vpg to generate the output signal Vo. More specifically, in response to a change (increase or decrease) of the first portion Ibp1, the driving signal Vpg changes accordingly, and the conduction level of the power transistor Mpp is controlled accordingly. In one embodiment, as shown in FIG. 2, the power transistor Mpp is a PMOS transistor.

The voltage positioning transistor Mset is coupled between the output node Nout and the bias node Nng. In this embodiment, the voltage positioning transistor Mset and the power transistor Mpp form a driving branch 23. A second portion (Ibp2) of the bias current Ib flows through the driving branch 23, wherein the voltage positioning transistor Mset operates according to a voltage difference of the control signal Vset and the output signal Vo to steer the first portion (Ibp1) and the second portion (Ibp2) of the bias current Ib, whereby the output signal Vo can be regulated.

As a more specific example, when the second portion Ibp2 is controlled to decrease in response to a change (for example decrease) of the output signal Vo, the first portion Ibp1 will increase accordingly. In one embodiment, in this case, the driving signal Vpg decreases so that the impedance of the power transistor Mpp decreases to supply more current to the output node, causing the output signal Vo to become higher. In one embodiment, as shown in FIG. 2, the voltage positioning transistor Mset is configured as a level shifter (or a source follower), wherein an almost fixed voltage difference exists between the gate (Vset) and the source (Vo) of the voltage positioning transistor Mset. With the operation described above, the voltage positioning transistor Mset steers the first portion Ibp1 and the second portion Ibp2 of the bias current Ib so as to regulate the output signal Vo. From another perspective, the voltage positioning transistor Mset positions the output signal Vo according to the control signal Vset (which is ideally not changed or slowly changed) with the gate-source voltage of Mset so that the output signal Vo can be regulated. In one embodiment, as shown in FIG. 2, the voltage positioning transistor Mset is a PMOS transistor.

According to the present invention, for improving the load transient response, in one embodiment, as shown in FIG. 2, the output stage circuit 20 further includes an overshoot detecting circuit 24 and a first overshoot suppressor 25.

In one embodiment, the overshoot detecting circuit 24 is coupled to the bias node Nng and the output node Nout and configured to operably detect an overshoot of the output signal Vo according to a voltage Vng on the bias node Nng, to generate an overshoot indicating signal Vovs.

In one embodiment, the first overshoot suppressor 25 is configured to operably generate a first overshoot suppressing signal Iovs1 according to the overshoot indicating signal Vovs, to control the power transistor Mpp to reduce the conduction resistance of the power transistor Mpp, whereby when an overshoot of the output signal Vo is detected, the overshoot of the output signal Vo is suppressed to be lower than a predetermined level, or is suppressed to be lower than a predetermined level within a predetermined time period after the overshoot occurs. In one embodiment, as shown in FIG. 2, the first overshoot suppressing signal Iovs1 is injected to the driving signal Vpg to control the power transistor Mpp.

Note that, it is not mandatory for the overshoot detecting circuit 24 to be coupled to the output node Nout, and it can be coupled to other nodes in other embodiments.

Figure 3A:
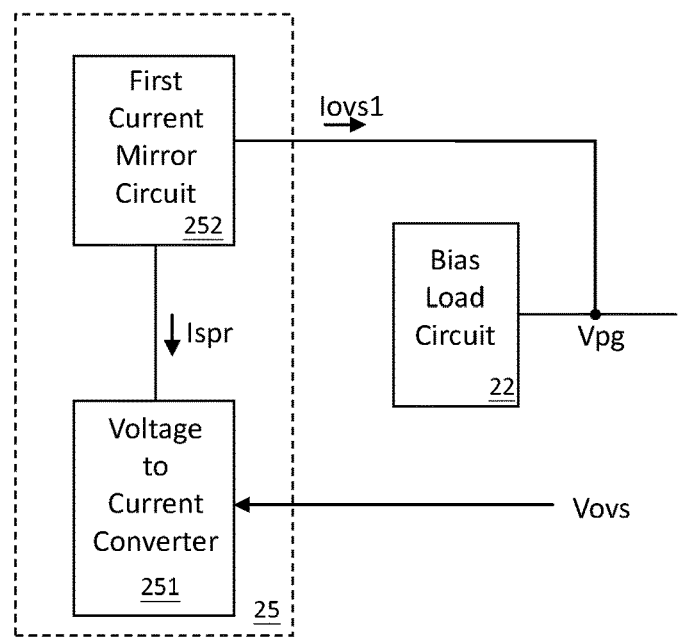
FIG. 3A shows a block diagram of an embodiment of the first overshoot suppressor of the fast response amplifier circuit according to the present invention.
Figure 3B:
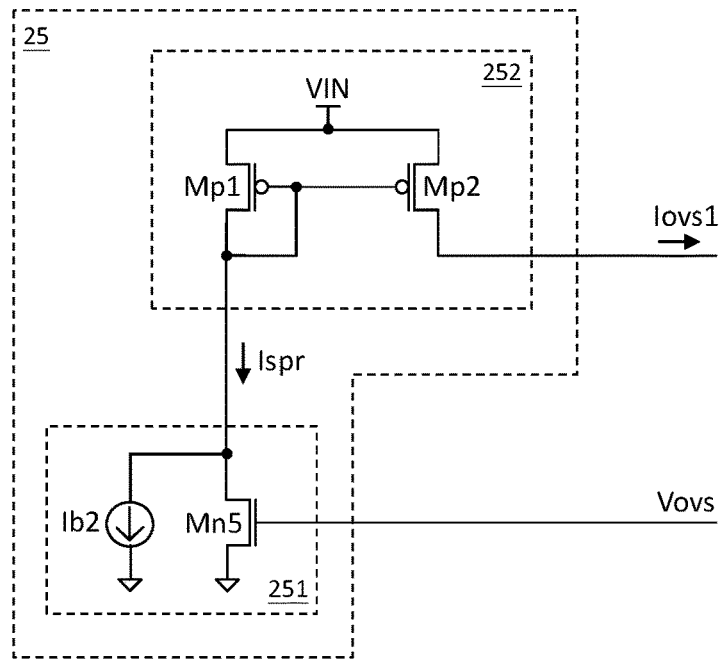
FIG. 3B shows a schematic diagram of a specific embodiment of the first overshoot suppressor of the fast response amplifier circuit according to the present invention.

FIG. 3A shows a block diagram of an embodiment of the first overshoot suppressor of the fast response amplifier circuit according to the present invention (overshoot suppressor 25). FIG. 3B shows a schematic diagram of a specific embodiment of the first overshoot suppressor of the fast response amplifier circuit according to the present invention (overshoot suppressor 25). As shown in FIG. 3A, in one embodiment, the first overshoot suppressor 25 includes a voltage to current converter 251 and a first current mirror circuit 252. The voltage to current converter 251 is configured to operably generate a suppressing current Ispr according to the overshoot indicating signal Vovs. The first current mirror circuit 252 is configured to operably generate the first overshoot suppressing signal Iovs1 by mirroring the suppressing current Ispr.

Referring to FIG. 3B, in one embodiment, the voltage to current converter 251 includes a voltage to current transistor Mn5 which is employed to sense the overshoot indicating signal Vovs through the gate of the voltage to current transistor Mn5 to generate the suppressing current Ispr. In one embodiment, the first current mirror circuit 252 employs a pair of transistors Mp1 and Mp2 to mirror the suppressing current Ispr to generate the first overshoot suppressing signal Iovs1.

Still referring to FIG. 3B, in one embodiment, the voltage to current converter 251 further includes a current source Ib2 to determine the DC operating point of the first overshoot suppressor 25.

Figure 4:
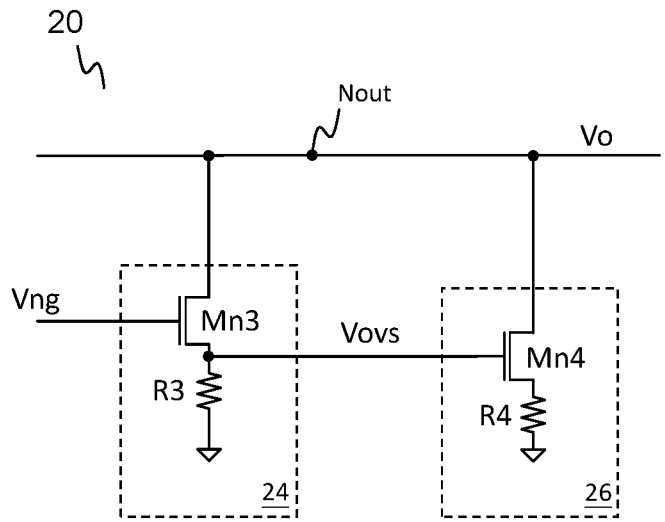
FIG. 4 shows a schematic diagram of specific embodiments of the overshoot detecting circuit and the second overshoot suppressor of the fast response amplifier circuit according to the present invention.

Please refer to FIGS. 2 and 4. FIG. 4 shows a schematic diagram of specific embodiments of the overshoot detecting circuit (overshoot detecting circuit 24) and the second overshoot suppressor (second overshoot suppressor 26) of the fast response amplifier circuit according to the present invention. In one embodiment, as shown in FIGS. 2 and 4, the output stage circuit 20 further includes a second overshoot suppressor 26 coupled to the output node Nout.

In one embodiment, the second overshoot suppressor 26 includes an overshoot suppressing transistor Mn4 which is coupled between the output node Nout and a low reference signal (e.g. ground). The overshoot suppressing transistor Mn4 is configured to operably pull down the output signal Vo to suppress the overshoot according to the overshoot indicating signal Vovs when the overshoot is detected. In a preferred embodiment, during steady state (i.e. no overshoot), the overshoot suppressing transistor Mn4 is configured to be OFF.

As shown in FIG. 4, in one embodiment, the second overshoot suppressor 26 further includes a pull-down resistor R4 which is coupled in series with the overshoot suppressing transistor Mn4. The pull-down resistor R4 is employed to determine the capability of the overshoot suppressing transistor Mn4 for suppressing overshoot. In one embodiment, the pull-down resistor R4 is adjustable.

Still referring to FIG. 2 and FIG. 4, in one embodiment, the overshoot detecting circuit 24 includes an overshoot detecting transistor Mn3 and a pull-down resistor R3. In one embodiment, the overshoot detecting transistor Mn3 and the pull-down resistor R3 are coupled in series to the output node Nout. The overshoot detecting transistor Mn3 is configured to operably detect an overshoot of the output signal Vo according to the voltage Vng on the bias node Nng to generate an overshoot indicating signal Vovs. In this embodiment, when an overshoot of the output signal Vo occurs, the impedance of the voltage positioning transistor Mset becomes smaller, whereby the voltage Vng on the bias node Nng rises in response to the overshoot of output signal Vo. In this embodiment, the overshoot detecting transistor Mn3, which is an NMOS transistor, is configured as a source follower, and the source voltage (i.e. overshoot indicating signal Vovs) of the overshoot detecting transistor also rises in response to the overshoot of output signal Vo. Thus, an overshoot indicating signal Vovs is generated in response to the overshoot of output signal Vo.

The pull-down resistor R3 determines the bias current of the overshoot detecting transistor Mn3. Note that, in this embodiment, since the drain of the overshoot detecting transistor Mn3 is electrically connected to the output node Nout, the overshoot detecting transistor Mn3 can also suppress the overshoot when the overshoot occurs. In one embodiment, the current capability (corresponding the size) of the overshoot suppressing transistor Mn4 is higher (i.e. larger size) than the overshoot detecting transistor Mn3.

Figure 5:
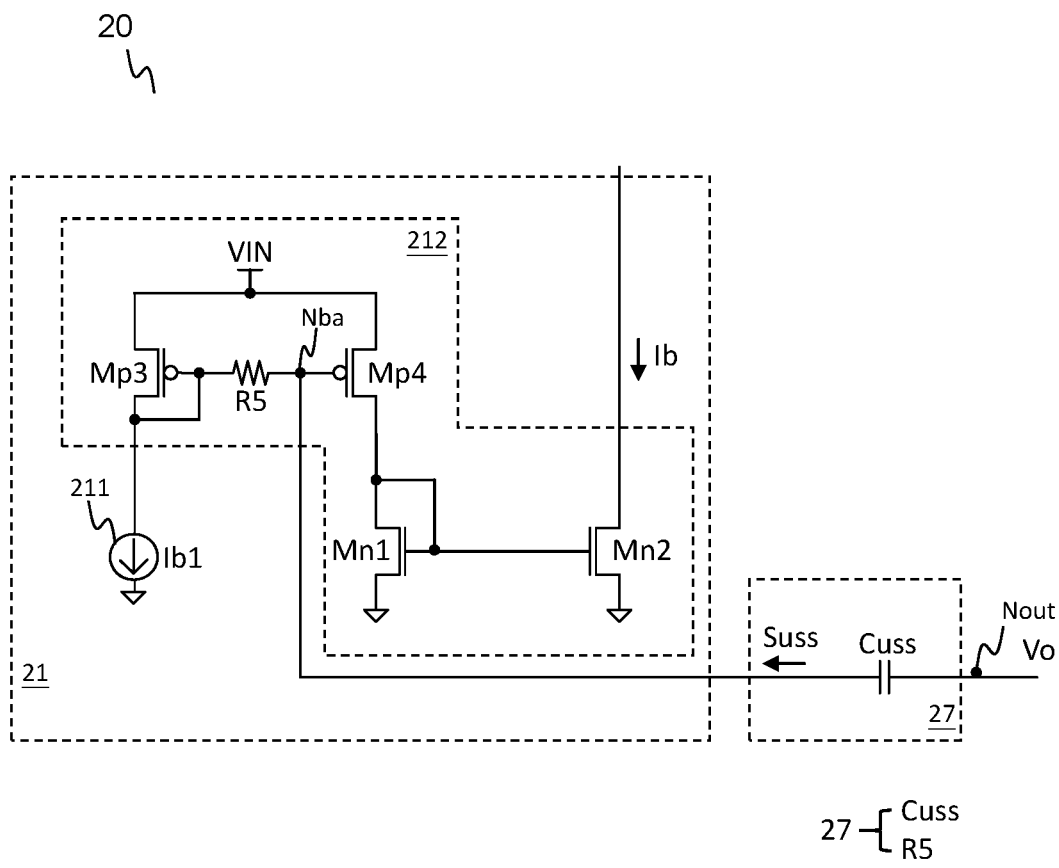
FIG. 5 shows a schematic diagram of specific embodiments of the bias current circuit and the undershoot suppressor of the fast response amplifier circuit according to the present invention.

Please refer to FIGS. 2 and 5. FIG. 5 shows a schematic diagram of specific embodiments of the bias current circuit (bias current circuit 21) and the undershoot suppressor (undershoot suppressor 27) of the fast response amplifier circuit according to the present invention. In one embodiment, as shown in FIGS. 2 and 5, the output stage circuit 20 further includes an undershoot suppressor 27. In one embodiment, as shown in FIG. 5, the undershoot suppressor 27 includes an undershoot suppressing capacitor Cuss which is coupled between the output node Nout and a bias adjusting node Nba of the bias current circuit 21. The undershoot suppressing capacitor Cuss is configured to operably generate an undershoot suppressing signal Suss at the bias adjusting node Nba to increase the bias current Ib to suppress an undershoot of the output signal Vo when the undershoot of the output signal Vo is detected.

More specifically, when an undershoot of the output signal Vo occurs, the undershoot causes the voltage at the bias adjusting node Nba to fall by the coupling effect of the undershoot suppressing capacitor Cuss. Therefore, the conduction current of the transistor Mp4 is controlled to be higher so that the bias current Ib is increased. In this case, the first portion (Ibp1) of the bias current Ib is also increased accordingly so that the driving signal Vpg decreases, which causes the conduction current of the power transistor Mpp to become higher, so as to suppress the undershoot of the output signal Vo.

FIG. 5 shows a schematic diagram of a specific embodiment of the undershoot suppressor (undershoot suppressor 27) and the bias current circuit (bias current circuit 21) of the fast response amplifier circuit according to the present invention. In one embodiment, as shown in FIG. 5, the undershoot suppressor 27 further includes a filtering resistor R5 which is coupled to the undershoot suppressing capacitor Cuss, and is configured to operably reduce a noise of the undershoot suppressing signal Suss at the bias adjusting node Nba. More specifically, the filtering resistor R5 can decouple the undershoot suppressing signal Suss from the gate of the transistor Mp3 and leads to faster recovering when the undershoot of the output signal Vo settles.

Still referring to FIG. 5, in one embodiment, the bias current circuit 21 includes a reference current source 211 and at least a second current mirror circuit (e.g. second current mirror circuit 212). The reference current source 211 is configured to operably provide a reference current Ib1. In this embodiment, the second current mirror circuit 212 is configured to operably generate the bias current Ib by mirroring the reference current source 211. In this embodiment, the bias adjusting node Nba is a control terminal of the second current mirror circuit 212, wherein the second current mirror circuit 212 operates according to a voltage at the control terminal of the second current mirror circuit 212 (i.e. the gate of the transistor Mp4 in this embodiment).

Note that, in one embodiment, the multiplication factor of the current mirror is 1. However, in other embodiments, the multiplication factor of the current mirror can be other numbers. Also note that, the number of stages of the current mirror can be 1 or more than 1, depending on the direction of the bias current. In this embodiment, the second current mirror circuit 212 includes two stages of current mirrors (Mp3 and Mp4, and Mn1 and Mn2).

Figure 6A:
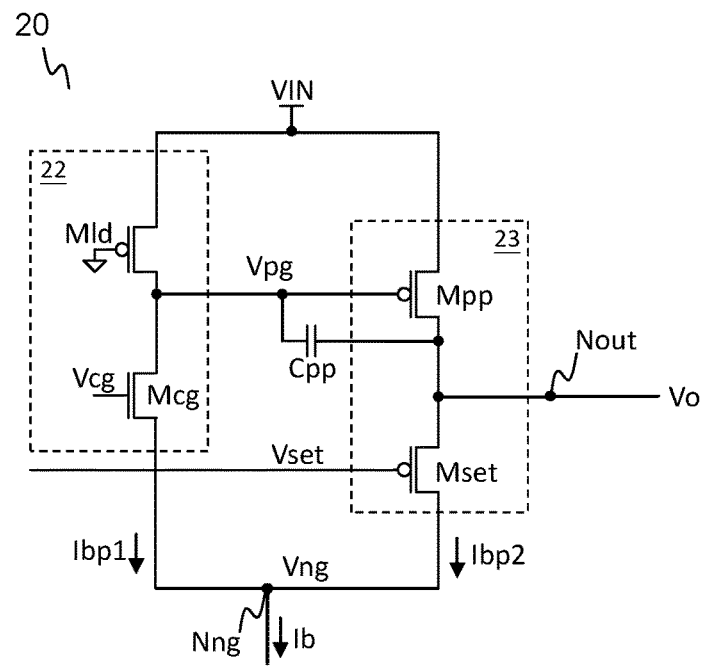
FIG. 6A and FIG. 6B show schematic diagrams of specific embodiments of the bias load circuit of the fast response amplifier circuit according to the present invention.
Figure 6B:
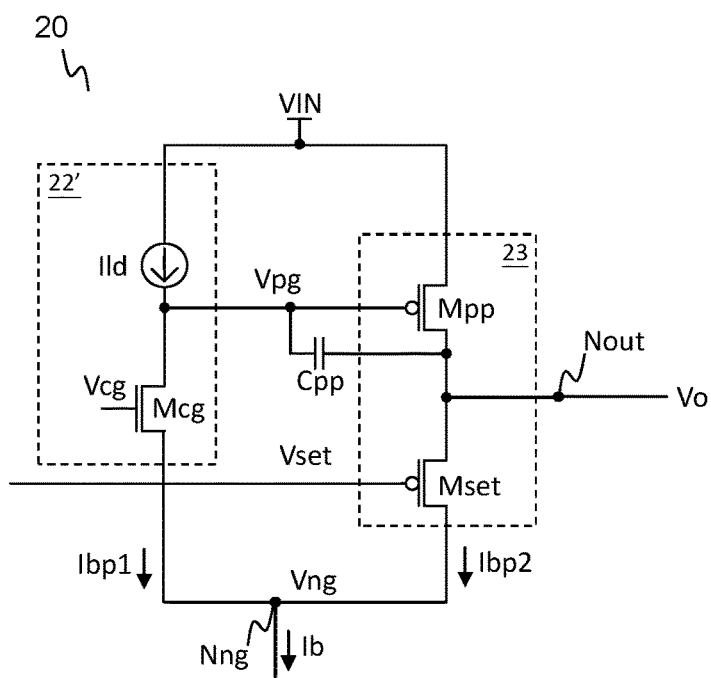

FIG. 6A and FIG. 6B show schematic diagrams of specific embodiments of the bias load circuit (bias load circuit 22, 22') of the fast response amplifier circuit according to the present invention. In one embodiment, the bias load circuit 22 includes a pull-up transistor Mld (FIG. 6A) or a pull-up current source Ild (FIG. 6B), and a common-gate transistor Mcg. The common-gate transistor Mcg is coupled in series with the pull-up transistor Mld or the pull-up current source Ild between the input power Vin and the bias node Nng to generate the driving signal Vpg at a joint node of the common-gate transistor Mcg and the pull-up transistor Mld or at a joint node of the common-gate transistor Mcg and the pull-up current source Ild. The common-gate transistor Mcg is biased with a bias voltage Vcg. From one perspective, the common-gate transistor Mcg is configured to separate the voltage Vng on the bias node Nng and the driving signal Vpg. In one preferred embodiment, as shown in FIG. 6A, the common-gate transistor Mcg is an NMOS transistor.

In this embodiment, when the first portion Ibp1 of the bias current Ib is reduced, the driving signal Vpg rises, which causes the conduction current of the power transistor Mpp to reduce. When the first portion Ibp1 of the bias current Ib is increased, the driving signal Vpg falls, which causes the conduction current of the power transistor Mpp to increase.

Still referring to FIG. 6A, in one embodiment, the output stage circuit 20 further includes an acceleration capacitor Cpp which is configured to operably couple an AC (alternating current) component (i.e. the overshoot or the undershoot) of the output signal Vo to the driving signal Vpg, whereby when an overshoot or an undershoot occurs, the AC component of the output signal Vo coupled through the acceleration capacitor Cpp will drive the power transistor Mpp to compensate the overshoot or the undershoot.

Figure 7:
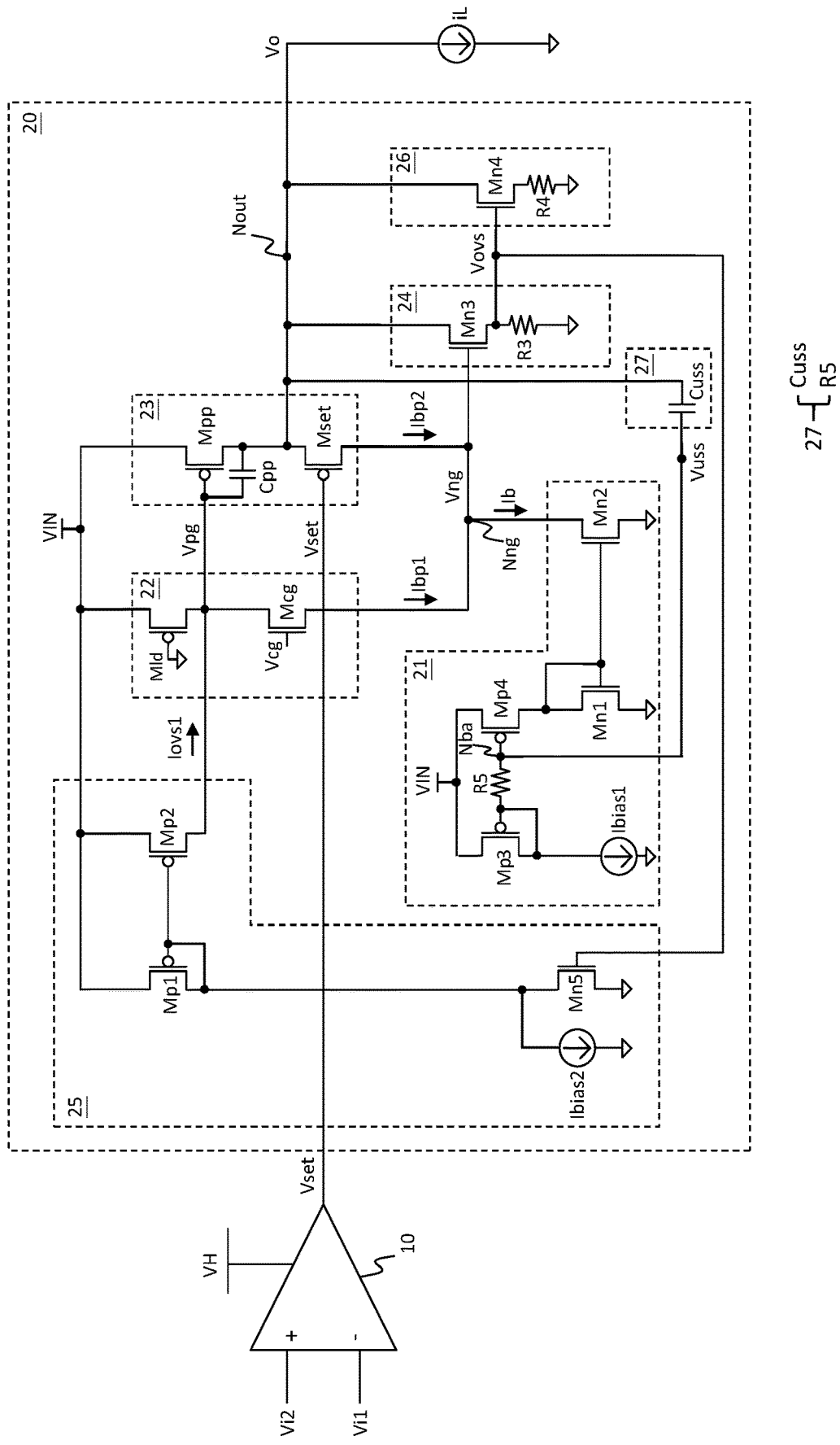
FIG. 7 shows a schematic diagram of a specific embodiment of the fast response amplifier circuit according to the present invention.

FIG. 7 shows a schematic diagram of a specific embodiment of the fast response amplifier circuit (fast response amplifier circuit 7) according to the present invention. In this embodiment, the components of the fast response amplifier circuit 7 are flattened into transistor level for illustration.

Figure 8:
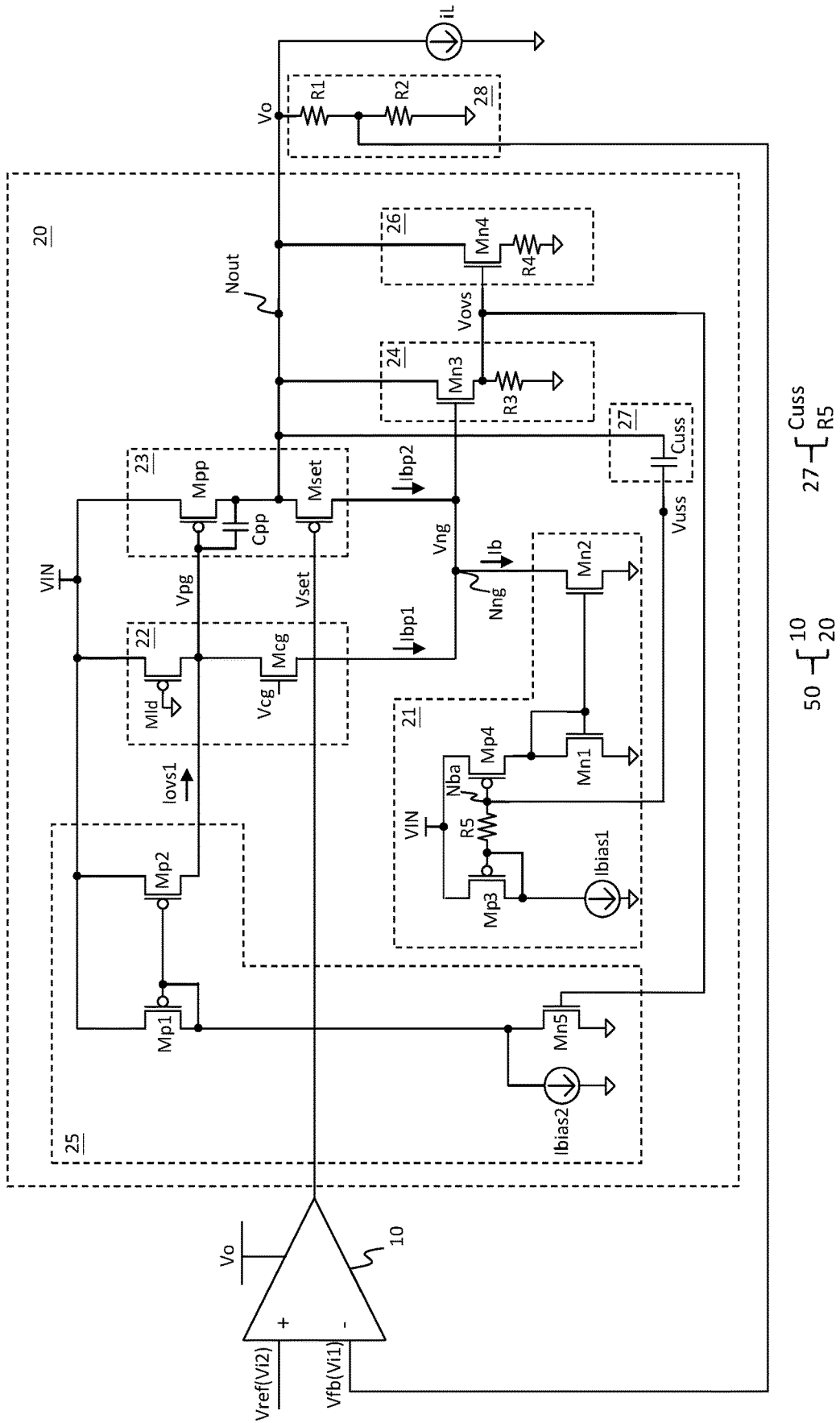
FIG. 8 shows a schematic diagram of a specific embodiment of a fast response linear regulator according to the present invention.

FIG. 8 shows a schematic diagram of a specific embodiment of a fast response linear regulator (fast response linear regulator 8) according to the present invention. In this embodiment, the fast response linear regulator 8 comprises a fast response amplifier circuit 50 and a voltage divider 28. The fast response amplifier circuit 50 as shown in FIG. 8 is another embodiment of the fast response amplifier circuit, but it can be replaced by any fast response amplifier circuit described in the present invention. The voltage divider 28 is coupled to the output node Nout, and is configured to operably generate a divided voltage Vfb of the output signal Vo. The first input signal Vi1 corresponds to the divided voltage Vfb of the output signal Vo, and the second input signal Vi2 corresponds to a reference signal Vref, such that the output signal Vo is regulated to a level proportional to the reference signal Vref. In one embodiment, the voltage divider 28 includes voltage division resistors R1 and R2. In one preferred embodiment, the output signal Vo is regulated as:

$$Vo = Vref*(1+R2/R1) = Vset + Vgs(Mset) \quad (eq. 1),$$

wherein Vgs(Mset) is the gate-source voltage of the voltage positioning transistor Mset.

In one preferred embodiment, the pre-stage circuit 10 is powered by the output signal Vo. In this case, the power rejection ratio of the fast response linear regulator 8 can be further improved. In other embodiments, the pre-stage circuit 10 can be powered by the input voltage VIN or other power sources.

Figure 9:
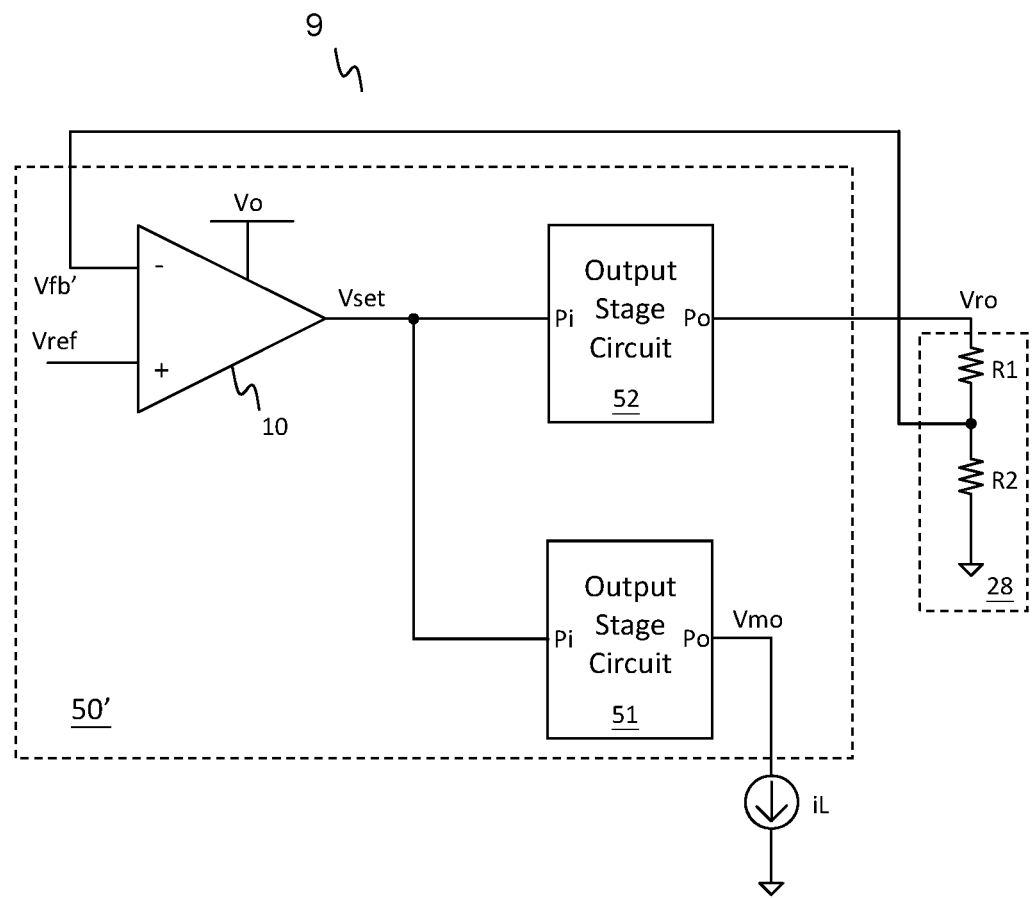
FIG. 9 shows a schematic diagram of a specific embodiment of a fast response linear regulator according to the present invention.

FIG. 9 shows a schematic diagram of a specific embodiment of a fast response linear regulator (fast response linear regulator 9) according to the present invention. The fast response linear regulator 9 generates a mirror output signal Vmo to provide a load iL.

The fast response linear regulator 9 comprises a fast response amplifier circuit 50' and a voltage divider 28.

The fast response amplifier circuit 50' includes a pre-stage circuit 10, and two output stage circuits 51 and 52. The output stage circuits 51 and 52 for example are identical to each other.

In this embodiment, the pre-stage circuit 10 is configured to operably generate a control signal Vset according to a difference between a divided voltage Vfb' of a regulated output signal Vro and a reference signal Vref. The control signal Vset controls the output stage circuit 52 to generate the regulated output signal Vro. The control signal Vset also controls the output stage circuit 51 to generate the mirror output signal Vmo to provide the load iL.

More specifically, the output stage circuit 51 is configured to operably generate the mirrored output signal Vmo through an output terminal Po of the output stage circuit 51 according to the control signal Vset received through an input terminal Pi of the output stage circuit 51. The output stage circuit 52 is configured to operably generate the regulated output signal Vro through an output terminal Po of the output stage circuit 52 according to the control signal Vset received through an input terminal Pi of the output stage circuit 52.

The voltage divider 28 is configured to operably generate the divided voltage Vfb' of the regulated output signal Vro. From one perspective, in this embodiment, the DC operating point of the fast response linear regulator 9 is determined by the loop formed by the pre-stage circuit 10, the output stage circuit 52, and the voltage divider 28.

Figure 10:
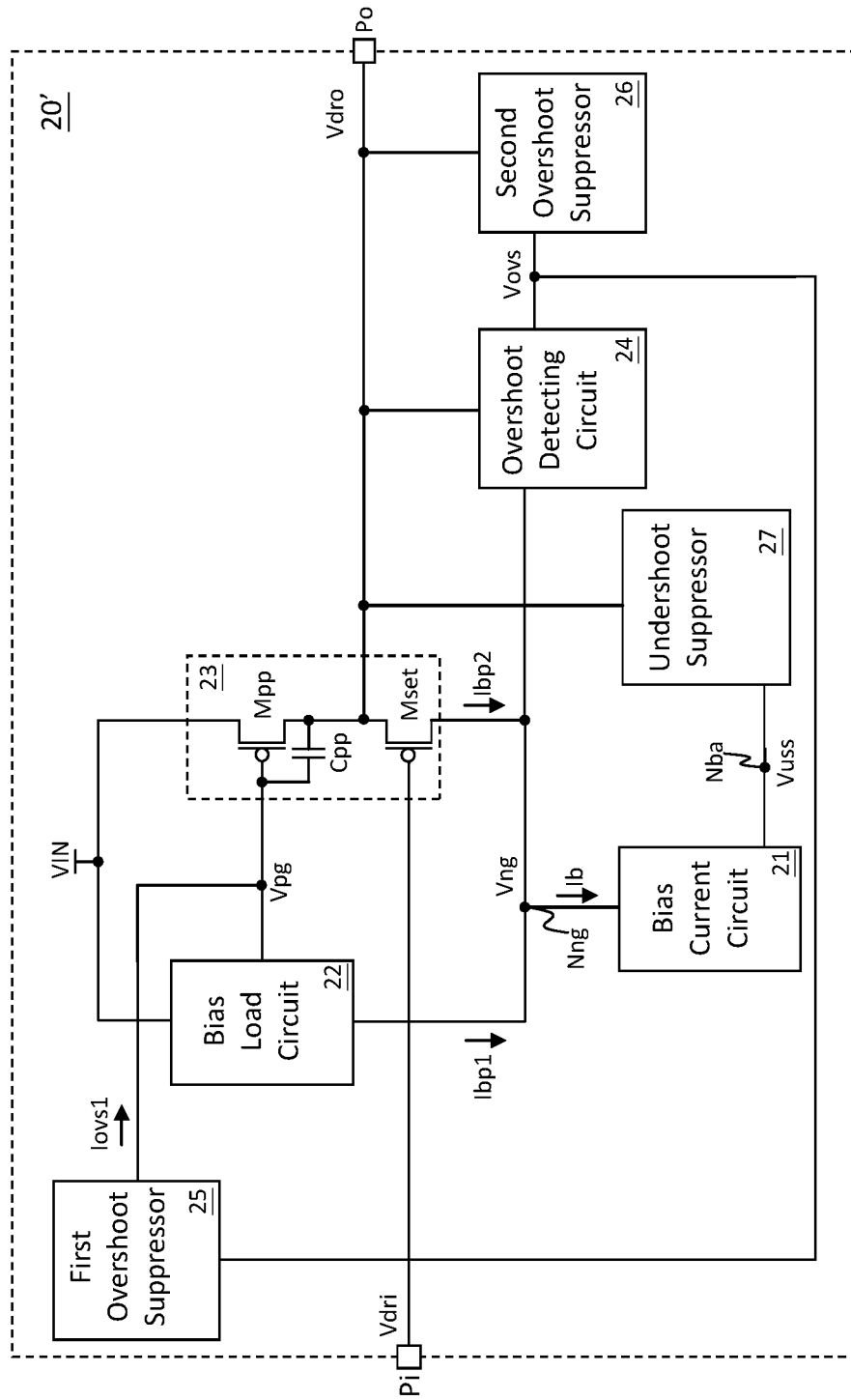
FIG. 10 shows a schematic diagram of a specific embodiment of the output stage circuit of the fast response linear regulator according to the present invention.

FIG. 10 shows a schematic diagram of a specific embodiment of the output stage circuit (output stage circuit 20') of the fast response linear regulator according to the present invention. Each of the two output stage circuits 52 and 51 in FIG. 9 for example corresponds to the embodiment of the output stage circuit 20' as shown in FIG. 10.

Still referring to FIG. 10, the output stage circuit 20' is similar to the embodiment of the output stage circuit 20 as shown in FIG. 2. The overshoot detecting circuit 24 detects an overshoot of the driving output signal Vdro according to a voltage Vng on the bias node Nng to generate an overshoot indicating signal Vovs. The first overshoot suppressor 25, the second overshoot suppressor 26, and/or the undershoot suppressor 27 operate similarly to the embodiment shown in FIG. 2 to suppress an overshoot or an undershoot of the driving output signal Vdro on an output terminal Po of the output stage circuit 20'. A driving input signal is received through the input terminal Pi of the output stage circuit 20' and is configured to control the voltage positioning transistor Mset to generate the driving output signal Vdro on the output terminal.

From one perspective, the regulated output signal Vro is regulated according the reference signal Vref. With the control signal Vset is determined by the loop as above, the output stage circuit 51 is open-loop-controlled by the control signal Vset to generate the mirrored output signal Vmo for providing the load iL. Any overshoot or undershoot on the mirrored output signal Vmo can be suppressed by the first overshoot suppressor 25, the second overshoot suppressor 26, and/or the undershoot suppressor 27 of the output stage circuit 51.

In summary, according to the present invention, the fast response amplifier circuit (e.g. the fast response amplifier circuit 2, 7, 50 or 50') or the fast response linear regulator (e.g. the fast response linear regulator 8 or 9) employs the overshoot detecting circuit 24, the first overshoot suppressor 25, the second overshoot suppressor 26, and the undershoot suppressor 27 as described above, so that the fast response amplifier circuits or the fast response linear regulators of the present invention can achieve fast response with low quiescent current, without the need of external capacitor.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A fast response amplifier circuit, comprising:
    a pre-stage circuit, configured to operably generate a control signal according to a difference between a first input signal and a second input signal;
    an output stage circuit, configured to operably generate an output signal at an output node according to the control signal; wherein the output stage circuit includes:
        a bias current circuit, configured to operably generate a bias current at a bias node;
        a bias load circuit, coupled between an input power and the bias node, and configured to operably generate a driving signal according to a first portion of the bias current, wherein the first portion of the bias current flows through the bias load circuit;

a power transistor, coupled between the input power and the output node, wherein the power transistor is controlled by the driving signal to generate the output signal; and a voltage positioning transistor, coupled between the output node and the bias node, wherein the voltage positioning transistor and the power transistor form a driving branch, and a second portion of the bias current flows through the driving branch, wherein the voltage positioning transistor operates according to a voltage difference of the control signal and the output signal to steer the first portion and the second portion of the bias current, whereby the output signal is regulated;

wherein the output stage circuit further includes:

an overshoot detecting circuit, coupled to the bias node and configured to operably detect an overshoot of the output signal according to a voltage on the bias node to generate an overshoot indicating signal; and a first overshoot suppressor, configured to operably generate a first overshoot suppressing signal according to the overshoot indicating signal to control the power transistor to adjust a conduction resistance of the power transistor, whereby when the overshoot of the output signal is detected, the overshoot of the output signal is suppressed to be lower than a predetermined level.

2. The fast response amplifier circuit of claim 1, wherein the first overshoot suppressor includes:

a voltage to current converter, configured to operably generate a suppressing current according to the overshoot indicating signal; and a first current mirror circuit, configured to operably generate the first overshoot suppressing signal by mirroring the suppressing current.

3. The fast response amplifier circuit of claim 1, wherein the output stage circuit further includes a second overshoot suppressor coupled to the output node, wherein the second overshoot suppressor includes:

an overshoot suppressing transistor, coupled between the output node and a low reference signal, and configured to operably pull down the output signal to suppress the overshoot according to the overshoot indicating signal when the overshoot is detected.

4. The fast response amplifier circuit of claim 1, wherein the overshoot detecting circuit includes an overshoot detecting transistor and a first biasing resistor, wherein the overshoot detecting transistor and the first biasing resistor are coupled in series between the output node and a low reference signal, wherein a control terminal of overshoot detecting transistor is coupled to the bias node to detect an overshoot of the output signal to generate the overshoot indicating signal.

5. The fast response amplifier circuit of claim 1, wherein the output stage circuit further includes an acceleration capacitor which is configured to operably couple an AC component of the output signal to the driving signal.

6. The fast response amplifier circuit of claim 1, wherein the output stage circuit further includes an undershoot suppressor, wherein the undershoot suppressor includes:

an undershoot suppressing capacitor, coupled between the output node and a bias adjusting node of the bias current circuit, and configured to operably generate an undershoot suppressing signal at the bias adjusting node to increase the bias current to suppress an undershoot of the output signal when an undershoot of the output signal is detected.

7. The fast response amplifier circuit of claim 6, wherein the undershoot suppressor further includes a filtering resistor which is coupled to the undershoot suppressing capacitor, and is configured to operably reduce a noise of the undershoot suppressing signal at the bias adjusting node.

8. The fast response amplifier circuit of claim 6, wherein the bias current circuit includes:

a reference current source which is configured to operably provide a reference current; and at least a second current mirror circuit, configured to operably generate the bias current by mirroring the reference current source, wherein the bias adjusting node is a control terminal of the second current mirror circuit, wherein the second current mirror circuit operates according to a voltage at the control terminal of the second current mirror circuit.

9. The fast response amplifier circuit of claim 8, wherein the first overshoot suppressor includes:

a voltage to current converter, configured to operably generate a suppressing current according to the overshoot indicating signal; and a first current mirror circuit, configured to operably generate the first overshoot suppressing signal by mirroring the suppressing current.

10. The fast response amplifier circuit of claim 9, further comprising a second overshoot suppressor coupled to the output node, wherein the second overshoot suppressor includes:

an overshoot suppressing transistor, coupled between the output node and a low reference signal, and configured to operably pull down the output signal to suppress an overshoot according to the overshoot indicating signal when an overshoot is detected.

11. The fast response amplifier circuit of claim 10, wherein the bias load circuit includes:

a pull-up transistor or a pull-up current source;

a common-gate transistor, coupled in series with the pull-up transistor or the pull-up current source between the input power and the bias node to generate the driving signal at a joint node of the common-gate transistor and the pull-up transistor or the pull-up current source.

12. The fast response amplifier circuit of claim 11, wherein the overshoot detecting circuit includes an overshoot detecting transistor and a first biasing resistor, wherein the overshoot detecting transistor and the first biasing resistor are coupled in series between the output node and a low reference signal, wherein a control terminal of overshoot detecting transistor is coupled to the bias node to detect an overshoot of the output signal to generate the overshoot indicating signal.

13. A fast response amplifier circuit, comprising:

a pre-stage circuit, configured to operably generate a control signal according to a difference between a first input signal and a second input signal;

an output stage circuit, configured to operably generate an output signal at an output node according to the control signal; wherein the output stage circuit includes:

a bias current circuit, configured to operably generate a bias current at a bias node;

a bias load circuit, coupled between an input power and the bias node, and configured to operably generate a driving signal according to a first portion of the bias current, wherein the first portion of the bias current flows through the bias load circuit;

a power transistor, coupled between the input power and the output node, wherein the power transistor is controlled by the driving signal to generate the output signal; and a voltage positioning transistor, coupled between the output node and the bias node, wherein the voltage positioning transistor and the power transistor form a driving branch, and a second portion of the bias current flows through the driving branch, wherein the voltage positioning transistor operates according to a voltage difference of the control signal and the output signal to steer the first portion and the second portion of the bias current, whereby the output signal is regulated;

wherein the bias current circuit includes:
a reference current source which is configured to operably provide a reference current; and
at least a second current mirror circuit, configured to operably generate the bias current by mirroring the reference current source, wherein the bias adjusting node is a control terminal of the second current mirror circuit, wherein the second current mirror circuit operates according to a voltage at the control terminal of the second current mirror circuit;

wherein the output stage circuit further includes:
an undershoot suppressing capacitor, coupled between the output node and a bias adjusting node of the bias current circuit, and configured to operably generate an undershoot suppressing signal at the bias adjusting node to increase the bias current to suppress an undershoot of the output signal when the undershoot of the output signal is detected.

14. A fast response linear regulator, comprising:
a fast response amplifier circuit, configured to generate an output signal on an output node according to a difference between a voltage division of the output signal and a reference signal; and
a voltage divider, coupled to the output node, and configured to operably generate a voltage division of the output signal; wherein the output signal is regulated to a level proportional to the reference signal;
wherein the fast response amplifier circuit includes:
a pre-stage circuit, configured to operably generate a control signal according to a difference between a first input signal and a second input signal;
an output stage circuit, configured to operably generate an output signal at an output node according to the control signal; wherein the output stage circuit includes:
a bias current circuit, configured to operably generate a bias current at a bias node;
a bias load circuit, coupled between an input power and the bias node, and configured to operably generate a driving signal according to a first portion of the bias current, wherein the first portion of the bias current flows through the bias load circuit;
a power transistor, coupled between the input power and the output node, wherein the power transistor is controlled by the driving signal to generate the output signal; and
a voltage positioning transistor, coupled between the output node and the bias node, wherein the voltage positioning transistor and the power transistor form a driving branch, and a second portion of the bias current flows through the driving branch, wherein the voltage positioning transistor operates according to a voltage difference of the control signal and the output signal to steer the first portion and the second portion of the bias current, whereby the output signal is regulated;

wherein the output stage circuit further includes:
an overshoot detecting circuit, coupled to the bias node and configured to operably detect an overshoot of the output signal according to a voltage on the bias node to generate an overshoot indicating signal;
a first overshoot suppressor, configured to operably generate a first overshoot suppressing signal according to the overshoot indicating signal to control the power transistor to adjust a conduction resistance of the power transistor, whereby when the overshoot of the output signal is detected, the overshoot of the output signal is suppressed to be lower than a predetermined level;
an undershoot suppressor, coupled between the output node and a bias adjusting node of the bias current circuit, and configured to operably generate an undershoot suppressing signal at the bias adjusting node to increase the bias current to suppress an undershoot of the output signal when an undershoot of the output signal is detected; and
a second overshoot suppressor, coupled between the output node and a low reference signal, and configured to operably pull down the output signal to suppress an overshoot according to the overshoot indicating signal when an overshoot is detected.

15. The fast response linear regulator of claim 14, wherein the undershoot suppressor includes an undershoot suppressing capacitor which is coupled between the output node and a bias adjusting node of the bias current circuit;
and the bias current circuit includes:
a reference current source which is configured to operably provide a reference current; and
at least a second current mirror circuit, configured to operably generate the bias current by mirroring the reference current source, wherein the bias adjusting node is a control terminal of the second current mirror circuit, wherein the second current mirror circuit operates according to a voltage at the control terminal of the second current mirror circuit;
and the first overshoot suppressor includes:
a V2I voltage to current converter, configured to operably generate a suppressing current according to the overshoot indicating signal; and
a first current mirror circuit, configured to operably generate the first overshoot suppressing signal by mirroring the suppressing current;
and the second overshoot suppressor includes:
an overshoot suppressing transistor, coupled between the output node and a low reference signal, and configured to operably pull down the output signal to suppress an overshoot according to the overshoot indicating signal when an overshoot is detected.

16. The fast response amplifier circuit of claim 14, wherein the pre-stage circuit is powered by the output signal.

17. A fast response linear regulator, comprising:
a fast response amplifier circuit, configured to generate a mirrored output signal according to a difference between a voltage division of a regulated output signal and a reference signal; and a voltage divider, configured to operably generate the voltage division of the regulated output signal; wherein the regulated output signal is regulated to a level proportional to the reference signal;

wherein the fast response amplifier circuit includes:
- a pre-stage circuit, configured to operably generate a control signal according to the difference between the voltage division of the regulated output signal and the reference signal;
- a first output stage circuit, configured to operably generate the mirrored output signal through an output terminal of the first output stage circuit according to the control signal received through an input terminal of the first output stage circuit;
- a second output stage circuit, configured to operably generate the regulated output signal through an output terminal of the second output stage circuit according to the control signal received through an input terminal of the second output stage circuit;

wherein each of the first output stage circuit and the second output stage circuit includes:
- a bias current circuit, configured to operably generate a bias current at a bias node;
- a bias load circuit, coupled between an input power and the bias node, and configured to operably generate a driving signal according to a first portion of the bias current, wherein the first portion of the bias current flows through the bias load circuit;
- a power transistor, coupled between the input power and the output terminal, wherein the power transistor is controlled by the driving signal to generate a driving output signal on the output terminal; and
- a voltage positioning transistor, coupled between the output terminal and the bias node, wherein the voltage positioning transistor and the power transistor form a driving branch, and a second portion of the bias current flows through the driving branch, wherein the voltage positioning transistor operates according to a voltage difference of a driving input signal through the input terminal of the output stage circuit and the driving output signal on the output terminal to steer the first portion and the second portion of the bias current, whereby the driving output signal on the output terminal is regulated;

wherein the output stage circuit further includes:
- an overshoot detecting circuit, coupled to the bias node and configured to operably detect an overshoot of the driving output signal according to a voltage on the bias node to generate an overshoot indicating signal;
- a first overshoot suppressor, configured to operably generate a first overshoot suppressing signal according to the overshoot indicating signal to control the power transistor to adjust a conduction resistance of the power transistor, whereby when the overshoot of the driving output signal is detected, the overshoot of the driving output signal is suppressed to be lower than a predetermined level;
- an undershoot suppressor, coupled between the output terminal and a bias adjusting node of the bias current circuit, and configured to operably generate an undershoot suppressing signal at the bias adjusting node to increase the bias current to suppress an undershoot of the driving output signal when an undershoot of the driving output signal is detected; and
- a second overshoot suppressor, coupled between the output terminal and a low reference signal, and configured to operably pull down the driving output signal to suppress an overshoot according to the overshoot indicating signal when an overshoot is detected;

wherein the control signal corresponds to the driving input signal of the first output stage circuit and the driving input signal of the second output stage circuit, and the mirrored output signal corresponds to the driving output signal of the first output stage circuit, and the regulated output signal corresponds to the driving output signal of the second output stage circuit.

* * * * *